United States Patent
Chen et al.

(10) Patent No.: US 10,498,230 B1
(45) Date of Patent: Dec. 3, 2019

(54) VOLTAGE CONTROL DEVICE

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/192,722

(22) Filed: Nov. 15, 2018

(30) Foreign Application Priority Data

Jul. 12, 2018 (TW) .............................. 107124001 A

(51) Int. Cl.
| | |
|---|---|
| *G05F 3/02* | (2006.01) |
| *H02M 3/07* | (2006.01) |
| *G05F 3/24* | (2006.01) |
| *H03K 5/24* | (2006.01) |
| *G01R 19/165* | (2006.01) |
| *H03K 19/0185* | (2006.01) |

(52) U.S. Cl.
CPC ........ *H02M 3/07* (2013.01); *G01R 19/16552* (2013.01); *G05F 3/242* (2013.01); *H03K 5/2472* (2013.01); *H03K 19/018571* (2013.01)

(58) Field of Classification Search
CPC . H02M 3/07; G01R 19/16552; H03K 5/2472; H03K 19/018571; G05F 3/242
USPC .......................................................... 327/536
See application file for complete search history.

(56) References Cited

U.S. PATENT DOCUMENTS

| | | | | |
|---|---|---|---|---|
| 5,553,295 A | * | 9/1996 | Pantelakis | H02M 3/07 363/60 |
| 5,914,632 A | * | 6/1999 | Fotouhi | H02M 3/07 327/390 |
| 5,946,258 A | * | 8/1999 | Evertt | G11C 16/30 327/536 |
| 6,151,255 A | * | 11/2000 | Joo | G11C 16/12 365/185.29 |
| 6,204,721 B1 | * | 3/2001 | Yuen | H02M 3/07 327/534 |
| 6,329,869 B1 | * | 12/2001 | Matano | G11C 5/143 327/536 |
| 6,998,891 B2 | | 2/2006 | Hsu | |
| 7,023,262 B2 | * | 4/2006 | Sim | G11C 5/147 323/313 |
| 7,091,770 B2 | * | 8/2006 | Schlaffer | G05F 3/24 323/316 |

(Continued)

FOREIGN PATENT DOCUMENTS

| | | |
|---|---|---|
| CN | 1129369 A | 8/1996 |
| CN | 107404315 A | 11/2017 |

(Continued)

*Primary Examiner* — Ryan Jager
(74) *Attorney, Agent, or Firm* — Winston Hsu

(57) ABSTRACT

A voltage control device includes a charge pump, a driving circuit, and a control circuit. The charge pump provides a first voltage. The driving circuit is coupled to the charge pump, and receives the first voltage and a reference voltage. The driving circuit outputs a driving signal according to an input signal, the first voltage and the reference voltage. The control circuit is coupled to the charge pump and the driving circuit. Before the first voltage reaches a threshold level, the control circuit adjusts the reference voltage to increase the voltage gap between the first voltage and the reference voltage.

20 Claims, 5 Drawing Sheets

(56) References Cited

U.S. PATENT DOCUMENTS

| | | | |
|---|---|---|---|
| 7,336,121 B2* | 2/2008 | Sim | G11C 5/147 327/536 |
| 9,007,120 B2 | 4/2015 | Chiu | |
| 9,395,728 B2 | 7/2016 | Chiu | |
| 2009/0015299 A1* | 1/2009 | Ryu | H03F 1/0211 327/108 |
| 2017/0110960 A1* | 4/2017 | Tang | H02M 3/07 |

FOREIGN PATENT DOCUMENTS

| | | |
|---|---|---|
| EP | 3 113 280 A1 | 1/2017 |
| JP | 2011-239271 A | 11/2011 |
| TW | I348086 | 9/2011 |
| TW | I431452 B | 3/2014 |
| TW | 201624892 A | 7/2016 |

* cited by examiner

US 10,498,230 B1

VOLTAGE CONTROL DEVICE

CROSS REFERENCE TO RELATED APPLICATION

This application claims priority of Taiwan application No. 107124001, which was filed on Jul. 12, 2018, and is included herein by reference.

TECHNICAL FIELD

The present invention is related to a voltage control device, and more particularly, to a voltage control device capable of stabilizing the output voltage quickly.

BACKGROUND

To meet the low power requirements of electronic devices, power specifications of integrated circuits (ICs) have been redesigned to operate in low voltage environment to reduce power consumption. Although the operation of low voltage can reduce power consumption, some components in the electronic device still require a higher voltage to complete the operation in order to complete the functions required for the electronic device. For example, the switch for wireless RF signals would need to operate with a higher voltage.

Generally, the higher voltage is often provided by the charge pump circuit. However, although the charge pump can provide a higher voltage, its driving capability is susceptible to the operation of the load component at back-end. In this case, if the electronic device has to use the high voltage provided by the charge pump to drive the component with a larger load component, the charge pump may not be able to raise the output voltage to the required range, thus further causing instability of the overall circuit system.

SUMMARY

One embodiment of the present invention discloses a voltage control device. The voltage control device includes a charge pump, a driving circuit, and a control circuit.

The charge pump provides a first voltage. The driving circuit is coupled to the charge pump, and receives the first voltage and a reference voltage. The driving circuit outputs a driving signal according to an input signal, the first voltage and the reference voltage. The control circuit is coupled to the charge pump and the driving circuit, and adjusts the reference voltage to increase a voltage gap between the first voltage and the reference voltage before the first voltage reaches a threshold value.

DETAILED DESCRIPTION

Figure 1:
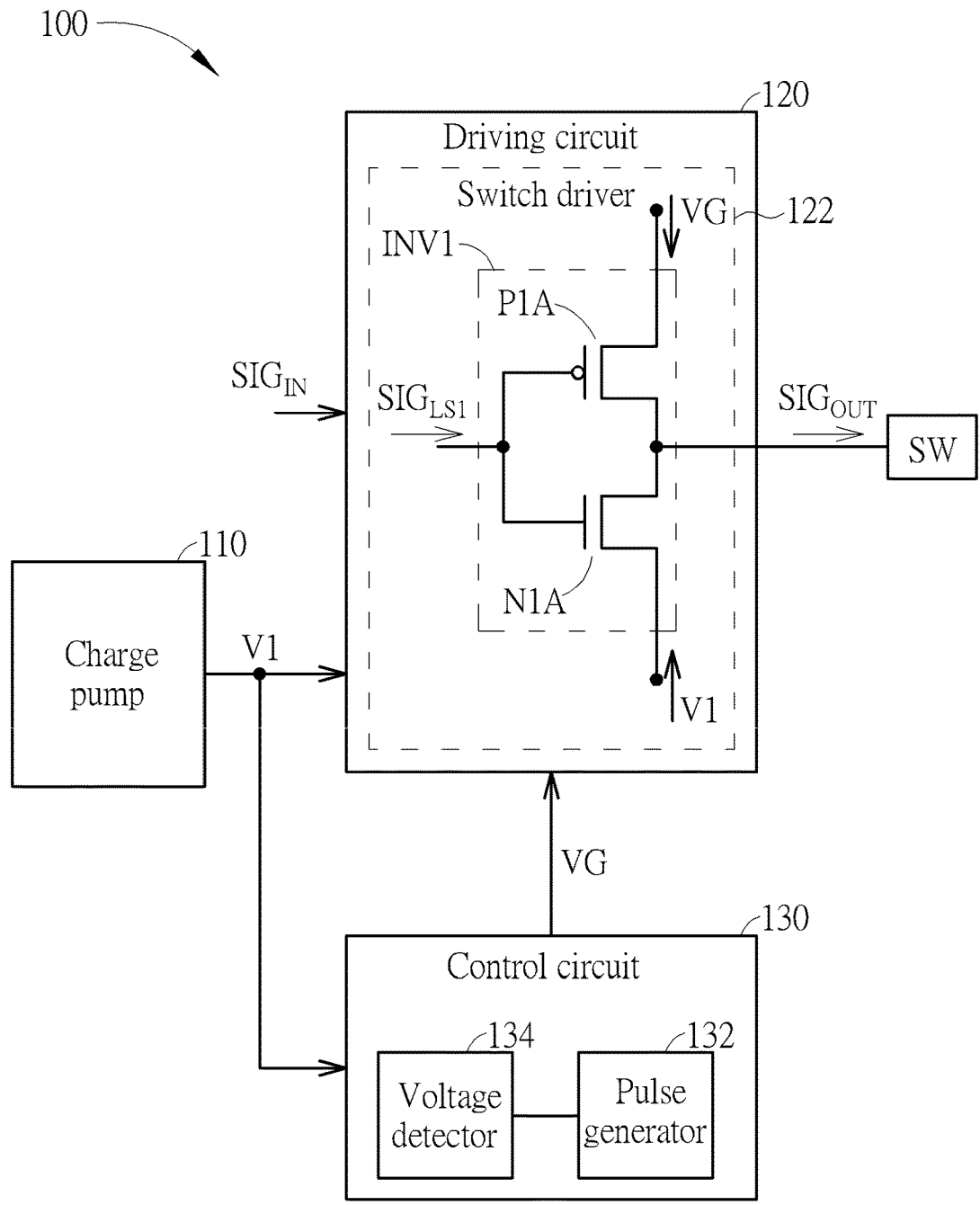
FIG. 1 shows a voltage control device according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a voltage control device 100 according to one embodiment of the present invention. The voltage control device 100 includes a charge pump 110, a driving circuit 120, and a control circuit 130.

The charge pump 110 can adjust or magnify a lower operation voltage in the system to provide a first voltage V1. In some embodiments, the operation voltage in the system can be, for example, 1.2V, and the target value of the first voltage V1 provided by the charge pump 110 can be, for example, 3V or −3V. For convenience of explanation, in the embodiment of FIG. 1, the target value of the first voltage V1 can be set to −3V.

The driving circuit 120 can be coupled to the charge pump 110. The driving circuit 120 can receive the first voltage V1 and a reference voltage VG, and can output a driving signal $SIG_{OUT}$ according to the input signal $SIG_{IN}$, the first voltage V1, and the reference voltage VG. In FIG. 1, the input signal $SIG_{IN}$ can be a control signal having a lower voltage, and the driving circuit 120 can convert the input signal $SIG_{IN}$ into the driving signal $SIG_{OUT}$ which is required by an external radio frequency (RF) switch according to the voltage provided by the charge pump 110, so that the external RF switch can be driven properly. However, in some embodiments, the driving signal $SIG_{OUT}$ is not limited to driving the RF switch SW, and can also be used to drive other types of circuits.

In FIG. 1, the driving circuit 120 can include a switch driver 122, and the switch driver 122 can include a first inverter INV1. The first inverter INV1 has an input terminal for receiving a first shift signal $SIG_{LS1}$ having a phase following with the input signal $SIG_{IN}$ (that is, the first shift signal $SIG_{LS1}$ is in phase with the input signal $SIG_{IN}$), a first power terminal for receiving the reference voltage VG, a second power terminal for receiving the first voltage V1, and an output terminal for outputting the driving signal $SIG_{OUT}$. That is, the driving circuit 120 can output the driving signal $SIG_{OUT}$ to be the reference voltage VG or the first voltage V1 according to voltage level of the input signal $SIG_{IN}$.

The first inverter INV1 includes a first P-type transistor P1A and a first N-type transistor N1A. The first P-type transistor P1A has a first terminal coupled to the first power terminal of the first inverter INV1, a second terminal coupled to the output terminal of the first inverter INV1, and a control terminal coupled to the input terminal of the first inverter INV1. The first N-type transistor has a first terminal coupled to the second terminal of the first P-type transistor, a second terminal coupled to the second power terminal of the first inverter INV1, and a control terminal coupled to the control terminal of the first P-type transistor. In some embodiments of the present invention, the transistors can be field effect transistors. Also, the first terminals of the transistors can be, for example but not limited to, the drains, the second terminals of the transistors can be, for example but not limited to, the sources, and the control terminals of the transistors can be, for example but not limited to, the gates.

Generally, the charge pump 110 would require a period of time to adjust or increase the first voltage V1 to the target voltage value after being activated, for example, to −3V.

Before the voltage provided by the charge pump 110 reaches to the target voltage value, the inverter INV1 of the driving circuit 120 may be unstable and cause leakage currents. In this case, the leakage currents may become a burden to the charge pump 110, increasing the time required by the charge pump 110 to raise the first voltage V1 to the target voltage value, and in some situations, even making the charge pump 110 fail to provide the desired first voltage V1. To prevent this issue, the control circuit 130 can be coupled to the charge pump 110 and the driving circuit 120, and can adjust the reference voltage VG to increase the voltage gap between first voltage V1 and the reference voltage VG before the first voltage V1 reaches to the threshold value. In some embodiments, the control circuit 130 can set the voltage gap between the first voltage V1 and the reference voltage VG to be greater than the operation voltage gap required by the first inverter INV1 of the driving circuit 120. Consequently, before the first voltage V1 reaches the threshold value, the voltage gap between the first voltage V1 and the reference voltage VG would be able to provide a sufficient headroom for the operation voltages of the first inverter INV1 in the driving circuit 120, avoiding the first N-type transistor N1A and the first P-type transistor P1A from being turned on simultaneously, and thereby avoiding the first inverter INV1 from leaking current and increasing the burden of the charge pump 110.

Figure 2:
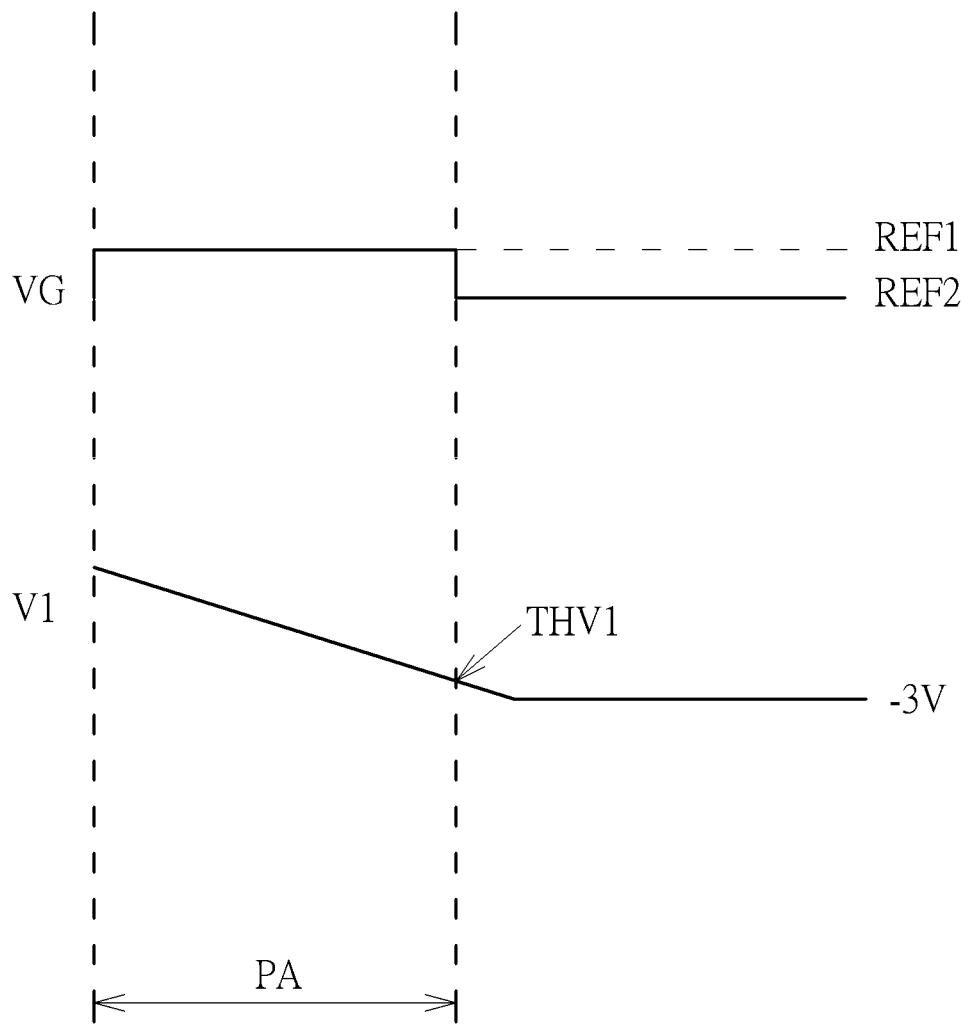
FIG. 2 shows a timing diagram of the first voltage and the reference voltage in FIG. 1 according to one embodiment of the present invention.

FIG. 2 shows a timing diagram of the first voltage V1 and the reference voltage VG according to one embodiment of the present invention. In FIG. 2, during the predetermined period PA, since the first voltage V1 has not reached the threshold value THV1, the control circuit 130 can adjust the reference voltage VG to the first predetermined reference value REF1 to increase the voltage gap between the reference voltage VG and the first voltage V1 during the predetermined period PA. For example, the initial value of the first voltage V1 can be 0V, the target value of the first voltage V1 (that is, the required voltage value) after raised by the charge pump 110 can be −3V, and the threshold value THV1 of the first voltage V1 can be −1.5V. The default value of the reference voltage VG can be 0V, and the first predetermined reference value REF1 can be 1.5V. That is, during the predetermined period PA, the voltage gap between the reference voltage VG and the first voltage V1 can be increased by 1.5V comparing to the default situation. Consequently, before the first voltage V1 reaches the threshold value THV1, the operation voltages for the first P-type transistor P1A and the first N-type transistor N1A in the first inverter INV1 would have sufficient headroom, reducing the possibility that the first P-type transistors P1A and the first N-type transistor N1A to be turned on simultaneously and generate the leakage current.

After the predetermined period PA, the first voltage V1 has reached the threshold value THV1 so the control circuit 130 can adjust the reference voltage VG to a second predetermined reference value REF2, that is, adjust the reference voltage VG to its default value of 0V. In some embodiments, the difference between the first predetermined reference value REF1 and threshold value THV1 of the first voltage V1 can be greater than the difference between the second predetermined reference value REF2 and threshold value THV1 of the first voltage V1.

In FIG. 1, the control circuit 130 can include a pulse generator 132. The pulse generator 132 can adjust the reference voltage VG to the first predetermined reference value REF1 during the predetermined period PA, and adjust the reference voltage VG to the second predetermined value REF2 after the predetermined period PA.

The charge pump 110 and the voltage control device 100 are at the initial stage when being enabled, and in this stage, the first voltage V1 usually has not reached the threshold voltage THV1. Therefore, in some embodiments, the control circuit 130 can activate the pulse generator 132 when the charge pump 110 or the voltage control device 100 is enabled. Consequently, the reference voltage VG would be adjusted to the first predetermined value REF1 during the predetermined period PA to increase the voltage gap between the reference voltage VG and the first voltage V1.

In FIG. 1, the control circuit 130 can further include a voltage detector 134 coupled to the pulse generator 132. The voltage detector 134 can detect the voltage signal for enabling the charge pump 110 or the voltage signal for enabling the voltage control device 100. Therefore, when the charge pump 110 or the voltage control device 100 is enabled, the control circuit 130 can activate the pulse generator 132 according to the detection result of the voltage detector 134 to increase the voltage gap between the reference voltage VG and the first voltage V1. However, in some embodiments, the system can activate the pulse generator 132 in the control circuit 130 directly when the charge pump 110 or the voltage control device 100 is enabled. In this case, the control circuit 130 may omit the voltage detector 134.

In addition, the present invention is not limited to adjusting the reference voltage VG according to the determination condition that whether the charge pump 110 or the voltage control device 100 is enabled. In some other embodiments, the control circuit 130 can also determine whether the first voltage V1 has reached the threshold value THV1 as the determination condition for adjusting the reference voltage VG.

Figure 3:
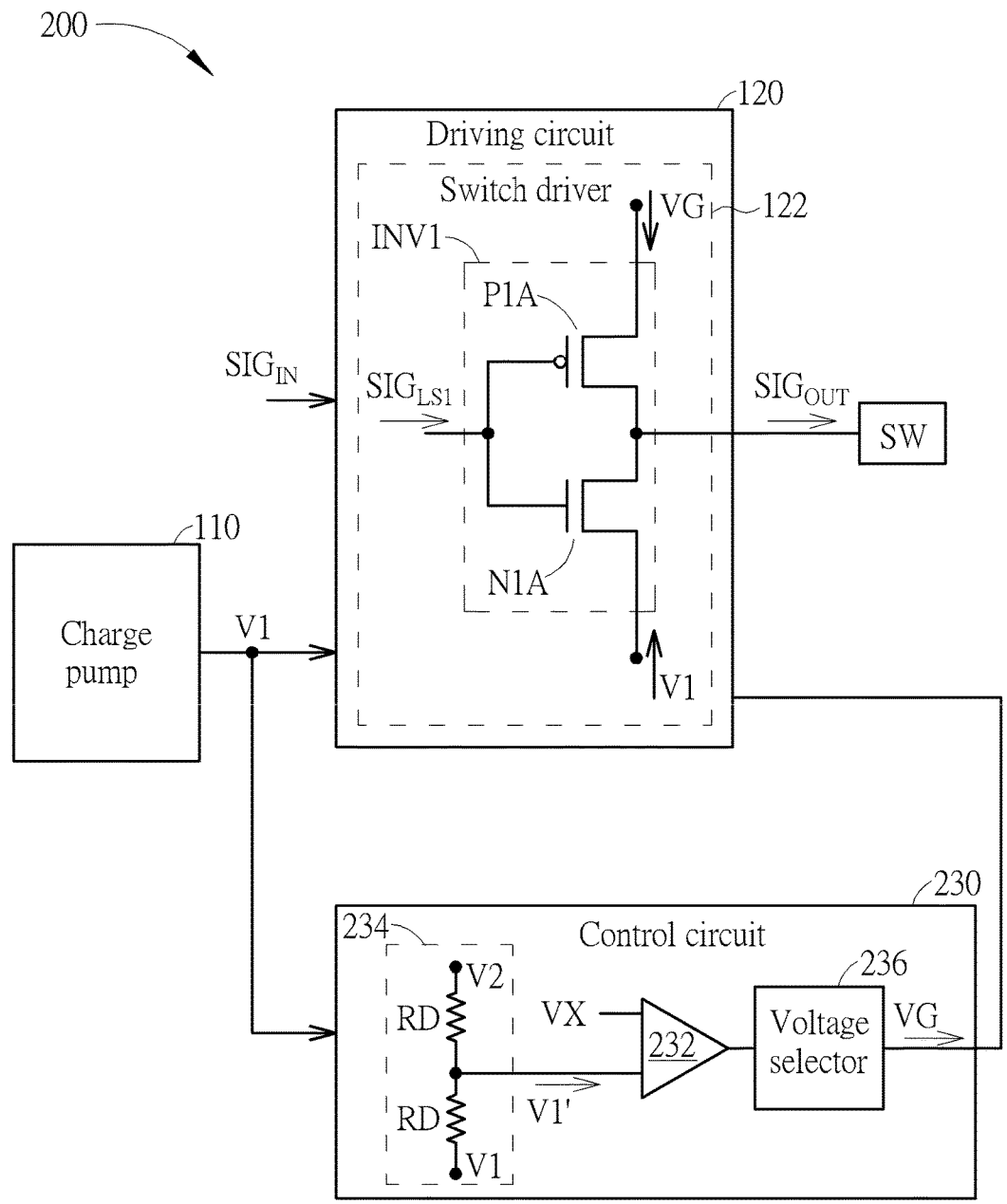
FIG. 3 shows a voltage control device according to another embodiment of the present invention.

FIG. 3 shows a voltage control device 200 according to one embodiment of the present invention. The voltage control devices 100 and 200 have similar structures and can be operated by similar principles. However, the control circuit 230 of the voltage control device 200 can include a comparator 232, and the control circuit 230 can adjust the reference voltage VG according to the output result of the comparator 232. That is, the comparator 232 can be used to compare the first voltage V1 and its threshold value THV1 to determine whether the first voltage V1 has reached the threshold value THV1, allowing the control circuit 230 to perform the operation accordingly. Consequently, the reference voltage VG can be adjusted instantly according to the operation status of the voltage control device 200, so as to avoid the charge pump 110 from failing to provide the first voltage V1 stably.

However, in the present embodiment, the target value (that is, the required voltage value) of the first voltage V1 is −3V and is negative voltage. Therefore, to make it easier for the comparator 232 to compare the voltages, the control circuit 230 can further include a comparison voltage generator 234. The comparison voltage generator 234 can receive the second voltage V2 (which is a positive voltage in the present embodiment) and the first voltage V1, and generate a comparison voltage V1' between the first voltage V1 and the second voltage V2 according to the first voltage V1 and the second voltage V2, and set the comparison voltage V1' to be positive. In this case, the first input terminal of the comparator 232 can receive the comparison voltage V1', and the second input terminal of the comparator 232 can receive the threshold voltage VX corresponding to the threshold value THV1. In this case, if the threshold voltage VX and the comparison voltage V1' are appropriately set, then the relation between the first voltage V1 and the threshold value THV1 can be derived by comparing the threshold voltage VX with the comparison voltage V1'. Also, the two input terminals of the comparator 232 will both receive positive voltages to simplify the internal circuit design for the comparator 232. Therefore, the conventional comparators can be used.

In FIG. 3, the comparison voltage generator 234 can include at least one voltage dividing element. For example, the comparison voltage generator 234 can include a plurality of resistors RD for voltage dividing, and the comparison voltage generator 234 can generate the comparison voltage V1' between the first voltage V1 and the second voltage V2 with the plurality of resistors RD. However, in some other embodiments, the comparison voltage generator 234 can also use a plurality of diodes, or a plurality of diode connected transistors to replace the resistors RD, and generate the comparison voltage V1' with the diodes, or the diode connected transistors.

According to the comparison result between the threshold voltage VX and the comparison voltage V1' by the comparator 232, the control circuit 230 can adjust the reference voltage VG accordingly. For example, when the comparator 232 determines that the comparison voltage V1' is higher than the threshold voltage VX, the control circuit 230 would adjust the reference voltage VG to the first predetermined reference value REF1 through the voltage selector 236. Also, when the comparator 232 determines that the comparison voltage V1' is lower than the threshold voltage VX, the control circuit 230 would adjust the reference voltage VG to the second predetermined reference value REF2 through the voltage selector 236. In some embodiments, the voltage selector 236 can include switch circuits and logic circuits. The logic circuits can control the switch circuits according to the determination result of the comparator 232 to couple the output terminal of the voltage selector 236 to the voltage terminal providing a voltage of the first predetermined reference value REF1 or the voltage terminal providing a voltage of the second predetermined reference voltage REF2. Consequently, the reference voltage VG can be adjusted instantly according to the real operation status of the voltage control device 200, assisting the charge pump 110 to stably provide the first voltage V1 as required by the system.

Furthermore, in some other embodiments, if the first voltage V1 is set to be positive, for example, 3V, then the control circuit 230 may omit the comparison voltage generator 234. That is, the control 230 can compare the first voltage V1 and its threshold value THV1 without generating the comparison voltage V1'.

Figure 4:
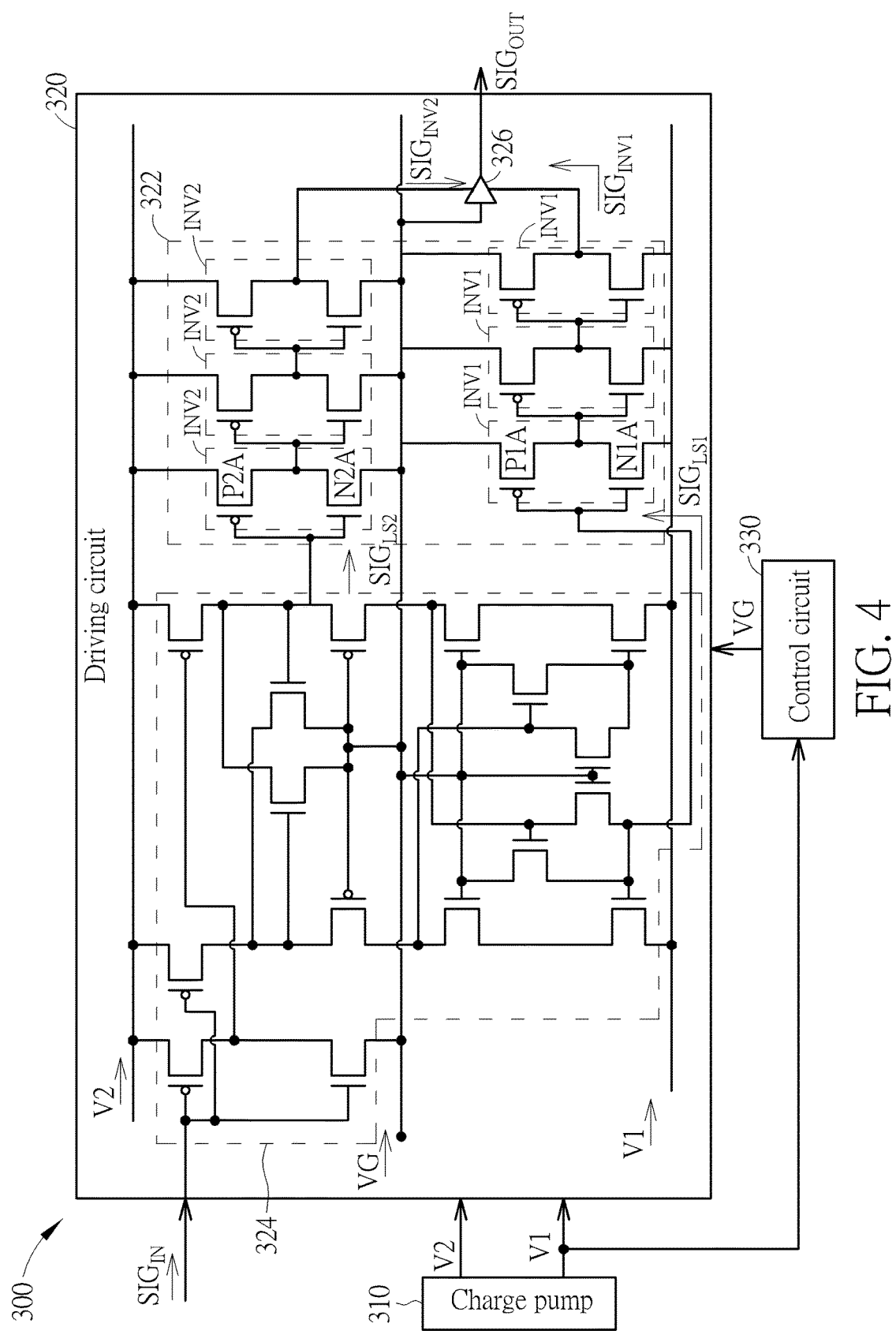
FIG. 4 shows a voltage control circuit according to another embodiment of the present invention.

FIG. 4 shows a voltage control circuit 300 according to one embodiment of the present invention. In FIG. 4, the driving circuit 320 can include a switch driver 322, a level shift circuit 324, and an output inverter 326.

The level shift circuit 324 can receive the input signal $SIG_{IN}$, the first voltage V1, the second voltage V2, and the reference voltage VG. In the present embodiment, the second voltage V2 can be positive voltage, for example, 3V, the first voltage V1 can be negative voltage, for example, −3V, and the reference voltage VG can be between the first voltage V1 and the second voltage V2, for example, 0V. However, in some other embodiments, the first voltage V1 can be positive voltage, and the second voltage V2 can be negative voltage.

The level shift circuit 324 can include a first output terminal and a second output terminal. The first output terminal of the level shift circuit 324 can output a first shift signal $SIG_{LS1}$ according to the input signal $SIG_{IN}$, the first voltage V1 and the reference voltage VG, and second output terminal of the level shift circuit 324 can output a second shift signal $SIG_{LS2}$ according to the input signal $SIG_{IN}$, the second voltage V2 and the reference voltage VG.

Figure 5:
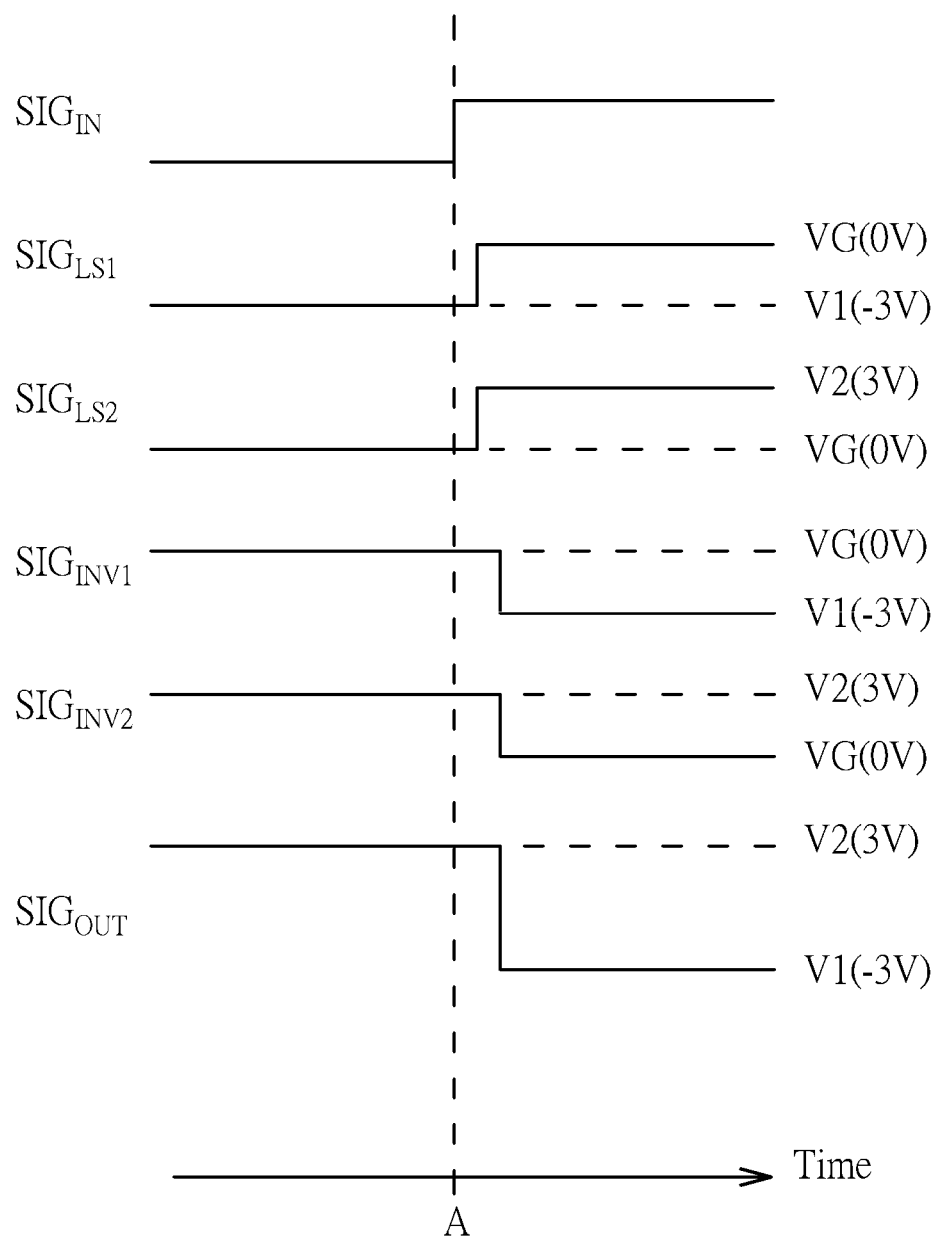
FIG. 5 shows a timing diagram of the voltage control device in FIG. 4 according to one embodiment of the present invention.

FIG. 5 shows a timing diagram of the voltage control device 300 according to one embodiment of the present invention. In FIG. 5, the phase of the first shift signal $SIG_{LS1}$ can follow with the input signal $SIG_{IN}$, and be switched between the reference voltage VG and the first voltage V1. For example, when the input signal $SIG_{IN}$ changes from a low voltage level to a high voltage level, the first shift signal $SIG_{LS1}$ can follow the input signal $SIG_{IN}$ to change from the first voltage V1 (−3V) to the reference voltage VG (0V) correspondingly.

Relatively, the phase of the second shift signal $SIG_{LS2}$ can follow with the input signal $SIG_{IN}$, and be switched between the reference voltage VG and the second voltage V2. For example, when the input signal $SIG_{IN}$ changes from a low voltage level to a high voltage level, the second shift signal $SIG_{LS2}$ can follow with the input signal $SIG_{IN}$ to change from the reference voltage VG (0V) to the second voltage V2 (3V) correspondingly.

Furthermore, the switch driver 322 can include at least one cascaded first inverter INV1 and at least one cascaded second inverter INV2. In FIG. 4, the switch driver 322 can include three stages of first inverters INV1 and three stages of second inverters INV2. Each stage of first inverter INV1 has an input terminal, an output terminal, a first power terminal, and a second power terminal. The input terminal of the first inverter INV1 can receive the first shift signal $SIG_{LS1}$ having a phase following with the input signal $SIG_{IN}$ (that is, the first shift signal $SIG_{LS1}$ is in phase with the input signal $SIG_{IN}$) or an inversion signal outputted by a previous stage of first inverter INV1. The first power terminal of the first inverter INV1 can receive the reference voltage VG, the second power terminal of the first inverter INV1 can receive the first voltage V1, and the output terminal of the first inverter INV1 can output an inversion signal. In the present embodiment, the related timing diagram of signal voltages is also shown in FIG. 5. After the first shift signal $SIG_{LS1}$ changes from the first voltage V1 (−3V) to the reference voltage VG (0V), the inversion signal $SIG_{INV1}$ will change from the reference voltage VG (0V) to the first voltage V1 (−3V) correspondingly.

In FIG. 4, each stage of first inverter INV1 can include a first P-type transistor P1A and a first N-type transistor N1A. The first P-type transistor P1A has a first terminal, a second terminal, and a control terminal. The first terminal of the first P-type transistor P1A is coupled to the first power terminal of the first inverter INV1, the second terminal of the first P-type transistor P1A is coupled to the output terminal of the first inverter INV1, and the control terminal of the first P-type transistor P1A is coupled to the input terminal of the first inverter INV1. The first N-type transistor N1A has a first terminal, a second terminal, and a control terminal. The first terminal of the first N-type transistor N1A is coupled to the second terminal of the first P-type transistor P1A, the second terminal of the first N-type transistor N1A is coupled to the second power terminal of the first inverter INV1, and the control terminal of the first N-type transistor N1A is coupled to the control terminal of the first P-type transistor P1A.

Each stage of second inverter INV2 has an input terminal, an output terminal, a first power terminal, and a second power terminal. The input terminal of the second inverter INV2 can receive the second shift signal $SIG_{LS2}$ having a phase following with the input signal $SIG_{IN}$ or an inversion signal outputted by a previous stage of second inverter INV2. The first power terminal of the second inverter INV2 can receive the second voltage V2, the second power terminal of the second inverter INV2 can receive the reference voltage VG, and the output terminal of the second inverter INV2 can output an inversion signal. In the present embodiment, after the second shift signal $SIG_{LS2}$ changes from the reference voltage VG (0V) to the second voltage V2 (3V), the inversion signal $SIG_{INV2}$ will change from the second voltage V2 (3V) to the reference voltage VG (0V) correspondingly.

In FIG. 4, each stage of second inverter INV2 can include a second P-type transistor P2A and a second N-type transistor N2A. The second P-type transistor P2A has a first terminal, a second terminal, and a control terminal. The first terminal of the second P-type transistor P2A is coupled to the first power terminal of the second inverter INV2, the second terminal of the second P-type transistor P2A is coupled to the output terminal of the second inverter INV2, and the control terminal of the second P-type transistor P2A is coupled to the input terminal of the second inverter INV2. The second N-type transistor N2A has a first terminal, a second terminal, and a control terminal. The first terminal of the second N-type transistor N2A is coupled to the second terminal of the second P-type transistor P2A, the second terminal of the second N-type transistor N2A is coupled to the second power terminal of the second inverter INV2, and the control terminal of the second N-type transistor N2A is coupled to the control terminal of the second P-type transistor P2A.

The output inverter 326 has an input terminal, a first power terminal, a second power terminal, and an output terminal. The input terminal of the output inverter 326 can receive the reference voltage VG, the first power terminal of the output inverter 326 can receive the inversion signal $SIG_{INV2}$ outputted by the last stage of second inverter INV2, the second power terminal of the output inverter 326 can receive the inversion signal $SIG_{INV1}$ outputted by the last stage of first inverter INV1, and the output terminal of the output inverter 326 can output the driving signal $SIG_{OUT}$.

In FIG. 5, when the input signal $SIG_{IN}$ is at the low voltage level, the inversion signal $SIG_{INV2}$ received by the first power terminal of the output inverter 326 would be the second voltage V2, and the inversion signal $SIG_{INV1}$ received by the second power terminal of the output inverter 326 would be the reference voltage VG. Since the input terminal of the output inverter 326 would receive the reference voltage VG, the output inverter 326 will output the driving signal $SIG_{OUT}$ to be the second voltage V2.

On the contrary, after the input signal $SIG_{IN}$ is changed to the high voltage level, the inversion signal $SIG_{INV2}$ received by the first power terminal of the output inverter 326 would change to the reference voltage VG, and the inversion signal $SIG_{INV1}$ received by the second power terminal of the output inverter 326 would change to the first voltage V1. In this case, the output inverter 326 will output the driving signal $SIG_{OUT}$ to be the first voltage V1.

That is, the driving circuit 320 can generate the driving signal $SIG_{OUT}$ with a larger voltage output according to the input signal $SIG_{IN}$ with a smaller voltage input, so the electronic elements, such as the RF switch in FIG. 1, can be driven accordingly.

In addition, in FIG. 4, the charge pump 310 can provide the second voltage V2. In this case, the control circuit 330 can choose to increase the voltage gap between the first voltage V1 and the reference voltage VG before the first voltage V1 reaches its threshold value, or to increase the voltage gap between the second voltage V2 and the reference voltage VG before the second voltage V2 reaches its threshold value according to the generating capability of the first voltage V1 and the second voltage V2 generated by the charge pump 310. Therefore, the first inverters INV1 and the second inverters INV2 in the driving circuit 320 can have sufficient headroom for the operation voltages during the voltage pumping process of the charge pump 310, reducing the leakage currents and the burden of the charge pump 310. In some embodiments, the control circuits 130, 230, and 330 can be operated with the same principles.

However, the present invention does not limit the charge pump 310 to provide the second voltage V2. In some other embodiments, the second voltage V2 can also be provided by a constant voltage source. That is, whenever the voltage control device 300 is enabled, the constant voltage source is able to provide the desired second voltage V2 stably without requiring additional time for adjusting the voltage. In this case, by properly assigning the first predetermined reference value REF1, the voltage control device 300 can ensure the operation voltages received by the first inverters INV1 and the second inverters INV2 of the driving circuit 320 to have sufficient headroom by adjusting the reference voltage VG to the first predetermined reference value REF1.

In summary, the voltage control devices provided by the embodiments of the present invention can adjust the reference voltage to increase the headroom for the operation voltages required by the internal components of the driving circuit before the voltage outputted by the charge pump has not reached the threshold value. Therefore, the leakage currents can be reduced, and the charge pump can enter the stable state faster.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage control device comprising:
a charge pump configured to provide a first voltage;
a driving circuit coupled to the charge pump, and configured to receive the first voltage and a reference voltage, and output a driving signal according to an input signal, the first voltage and the reference voltage; and
a control circuit coupled to the charge pump and the driving circuit, and configured to adjust the reference voltage to increase a voltage gap between the first voltage and the reference voltage before the first voltage reaches a threshold value.

2. The voltage control device of claim 1, wherein the voltage gap is greater than an operation voltage gap required by an inverter of the driving circuit.

3. The voltage control device of claim 1, wherein the control circuit adjusts the reference voltage to a first predetermined reference value to increase the voltage gap within a predetermined period.

4. The voltage control device of claim 3, wherein the control circuit adjusts the reference voltage to a second predetermined reference value after the predetermined period, and a difference between the first predetermined reference value and the threshold value is greater than a difference between the second predetermined reference value and the threshold value.

5. The voltage control device of claim 3, wherein the control circuit adjusts the reference voltage to the first predetermined reference value to increase the voltage gap correspondingly when the charge pump or the voltage control device is enabled.

6. The voltage control device of claim 5, wherein the control circuit includes a voltage detector configured to detect a voltage signal for enabling the charge pump or a voltage signal for enabling the voltage control device.

7. The voltage control device of claim 3, wherein the control circuit further comprises a pulse generator configured to adjust the reference voltage to the first predetermined reference value within the predetermined period.

8. The voltage control device of claim 1, wherein the control circuit comprises a comparator, and the control circuit adjusts the reference voltage according to an output result of the comparator.

9. The voltage control device of claim 8, wherein:
the control circuit further comprises a comparison voltage generator configured to receive a second voltage and the first voltage, and generate a comparison voltage between the first voltage and the second voltage according to the first voltage and the second voltage; and
the comparator has a first input terminal configured to receive the comparison voltage, and a second input terminal configured to receive a threshold voltage corresponding to the threshold value.

10. The voltage control device of claim 9, wherein the comparison voltage generator comprises a plurality of resistors for voltage dividing, a plurality of diodes, or a plurality of diode connected transistors, and the comparison voltage generator generates the comparison voltage between the first voltage and the second voltage with the plurality of resistors, the plurality of diodes, or the plurality of diode connected transistors.

11. The voltage control device of claim 9, wherein:
when the comparator determines that the comparison voltage is higher than the threshold voltage, the control circuit adjusts the reference voltage to a first predetermined reference value;
when the comparator determines that the comparison voltage is lower than the threshold voltage, the control circuit adjusts the reference voltage to a second predetermined reference value; and
a difference between the first predetermined reference value and the threshold value is greater than a difference between the second predetermined reference value and the threshold value.

12. The voltage control device of claim 1, wherein the driving circuit comprises a switch driver comprising:
at least one stage of first inverter, each stage of first inverter having an input terminal configured to receive a first shift signal having a phase following with the input signal or an inversion signal outputted by a previous stage of first inverter, a first power terminal configured to receive the reference voltage, a second power terminal configured to receive the first voltage, and an output terminal configured to output an inversion signal or the driving signal.

13. The voltage control device of claim 12, wherein each stage of first inverter comprises:
a first P-type transistor having a first terminal coupled to the first power terminal of the first inverter, a second terminal coupled to the output terminal of the first inverter, and a control terminal coupled to the input terminal of the first inverter; and
a first N-type transistor having a first terminal coupled to the second terminal of the first P-type transistor, a second terminal coupled to the second power terminal of the first inverter, and a control terminal coupled to the control terminal of the first P-type transistor.

14. The voltage control device of claim 12, wherein the switch driver further comprises:
at least one stage of second inverter, each stage of second inverter having an input terminal configured to receive a second shift signal having a phase following with the input signal or an inversion signal outputted by a previous stage of second inverter, a first power terminal configured to receive a second voltage, a second power terminal configured to receive the reference voltage, and an output terminal configured to output an inversion signal.

15. The voltage control device of claim 14, wherein the each stage of second inverter comprises:
a second P-type transistor having a first terminal coupled to the first power terminal of the second inverter, a second terminal coupled to the output terminal of the second inverter, and a control terminal coupled to a input terminal of the second inverter; and
a second N-type transistor having a first terminal coupled to the second terminal of the second P-type transistor, a second terminal coupled to the second power terminal of the second inverter, and a control terminal coupled to the control terminal of the second P-type transistor.

16. The voltage control device of claim 14, wherein the driving circuit further comprises a level shift circuit configured to receive the input signal, the first voltage, and the second voltage, and the level shift circuit comprises:
a first output terminal configured to output the first shift signal according to the input signal, the first voltage and the reference voltage; and
a second output terminal configured to output the second shift signal according to the input signal, the second voltage, and the reference voltage.

17. The voltage control device of claim 14, wherein the switch driver further comprises:
an output inverter having a first input terminal configured to receive the reference voltage, a first power terminal configured to receive an inversion signal outputted by a last stage of second inverter of the at least one stage of second inverter, a second power terminal configured to receive an inversion signal outputted by a last stage of first inverter of the at least one cascaded first inverter, and an output terminal configured to output the driving signal.

18. The voltage control device of claim 14, wherein the second voltage is provided by a constant voltage source.

19. The voltage control device of claim 14, wherein the charge pump is further configured to provide the second voltage.

20. The voltage control device of claim 14, wherein the second voltage is a positive voltage, the first voltage is a negative voltage, and the reference voltage is between the first voltage and the second voltage.

* * * * *